United States Patent
Muchow et al.

(10) Patent No.: US 7,647,832 B2
(45) Date of Patent: Jan. 19, 2010

(54) MICROMECHANICAL DEVICE AND METHOD FOR PRODUCING A MICROMECHANICAL DEVICE

(75) Inventors: Joerg Muchow, Reutlingen (DE); Hubert Benzel, Pliezhausen (DE); Markus Lang, Reutlingen (DE); Regina Grote, Reutlingen (DE); Simon Armbruster, Gomaringen (DE); Gerhard Lammel, Tuebingen (DE); Christoph Schelling, Reuflingen (DE); Volkmar Senz, Metzingen (DE)

(73) Assignee: Robert Bosch GmbH, Stuttgart (DE)

( * ) Notice: Subject to any disclaimer, the term of this patent is extended or adjusted under 35 U.S.C. 154(b) by 273 days.

(21) Appl. No.: 11/600,672

(22) Filed: Nov. 15, 2006

(65) Prior Publication Data

US 2007/0126069 A1    Jun. 7, 2007

(30) Foreign Application Priority Data

Nov. 22, 2005  (DE) .................. 10 2005 055 473

(51) Int. Cl.
*G01L 7/00*   (2006.01)
*G01P 15/00*  (2006.01)

(52) U.S. Cl. ..................................... 73/714; 73/514.33

(58) Field of Classification Search ............. 73/514.33, 73/514.34, 415.16, 514.29, 514.01, 514.36, 73/714–715, 727

See application file for complete search history.

(56) References Cited

U.S. PATENT DOCUMENTS

| 5,081,867 A * | 1/1992 | Yamada .................. 73/514.33 |
| 5,095,349 A * | 3/1992 | Fujii et al. .................. 257/108 |
| 5,520,051 A * | 5/1996 | Fujii et al. ............... 73/514.36 |
| 6,158,283 A * | 12/2000 | Shinogi et al. ........... 73/514.33 |
| 7,223,624 B2 * | 5/2007 | Wu et al. ...................... 438/52 |
| 2005/0172717 A1 * | 8/2005 | Wu et al. ................. 73/514.34 |
| 2006/0137457 A1 * | 6/2006 | Zdeblick ....................... 73/715 |
| 2006/0261424 A1 * | 11/2006 | Van Der Wiel ............ 257/417 |
| 2007/0169558 A1 * | 7/2007 | Benzel et al. ................. 73/754 |

FOREIGN PATENT DOCUMENTS

| DE | 103 23 559 |   | 12/2004 |
| JP | 03-113337 | * | 5/1991 |
| JP | 08-160072 | * | 6/1996 |

* cited by examiner

*Primary Examiner*—Helen C. Kwok
(74) *Attorney, Agent, or Firm*—Kenyon & Kenyon LLP

(57) ABSTRACT

A micromechanical device and a method for producing this device are provided, the device having a sensor pattern that includes a spring pattern and a seismic mass. The seismic mass may be connected to the substrate material via the spring pattern, and a clearance may be provided in a direction perpendicular to the major substrate plane between the spring pattern and the substrate material. Alternatively, the spring pattern and the seismic mass may have a common, essentially continuous, front side surface.

8 Claims, 2 Drawing Sheets

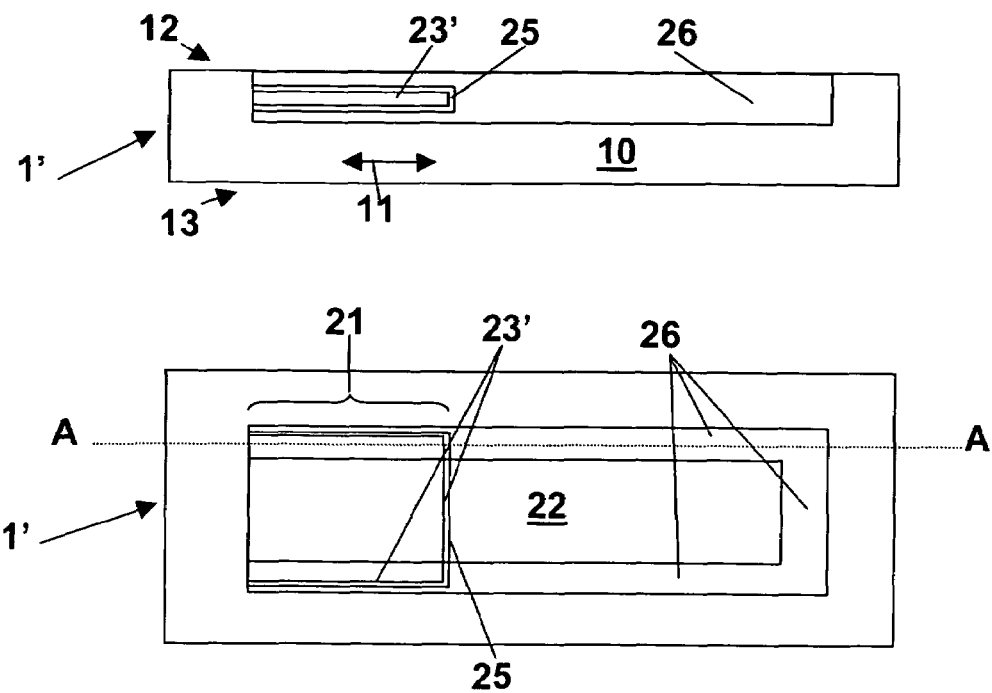
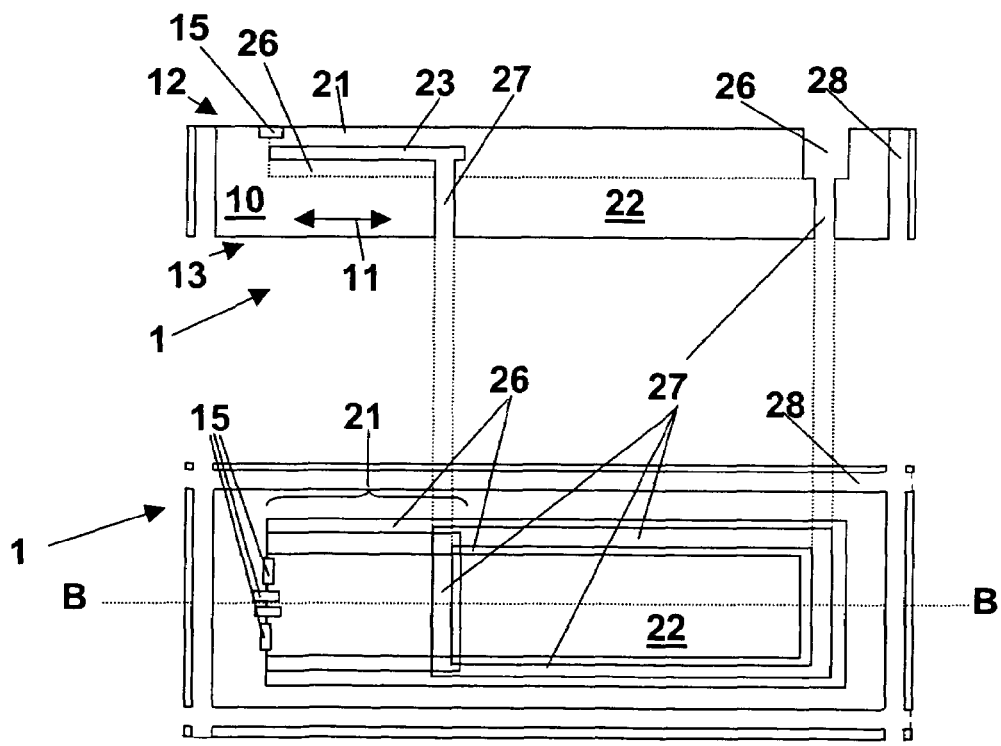
Figure 2

MICROMECHANICAL DEVICE AND METHOD FOR PRODUCING A MICROMECHANICAL DEVICE

FIELD OF THE INVENTION

The present invention relates to a micromechanical device configured as a sensor having a seismic mass.

BACKGROUND INFORMATION

A micromechanical device, e.g., a pressure sensor, is disclosed in published German patent document DE 103 23 559, in which pressure sensor the functionality of the sensor pattern is based on a piezoresistive converter principle for converting a mechanical force into an electrical signal. In this context, it is disadvantageous that a plurality of sensors is required to measure several different mechanical variables, for instance to measure a pressure or an acceleration, the sensors furthermore generally being based on different converter principles and therefore unable to be representable on one chip in a monolithically integrated manner. Applications in which simultaneous recording of a plurality of different mechanical variables, in particular pressure and acceleration, are desirable, are also found in the measurement of tire pressure or also in the sensing of side impacts in the automotive field. It is furthermore desirable to produce a plurality of sensor patterns in a space that is as small as possible. In addition, this also reduces the costs of producing the sensor patterns.

SUMMARY OF THE INVENTION

The micromechanical device according to the present invention has the advantage that, in a direction perpendicular to the main substrate plane, a clearance is provided between the spring pattern and the substrate material, or rather that the spring pattern and the seismic mass have a common front side surface that is essentially continuous. Because of this, it is advantageously possible to manufacture the micromechanical device according to the present invention, having a seismic mass, the micromechanical device thus being able to form an acceleration sensor, while using manufacturing steps identical as those used in manufacturing a pressure sensor. Furthermore, the essentially continuous front side surface of the spring pattern and of the seismic mass makes it possible that, simultaneously with rear side production of the seismic mass, separation of the various micromechanical devices that were produced in common and were originally present on a common wafer (or rather precursor patterns thereof) are possible.

According to the present invention, it is particularly advantageous if an additional sensor pattern is provided in the seismic mass, the additional sensor pattern having a diaphragm pattern provided at the front side surface and a closed cavity provided below the diaphragm pattern in the direction perpendicular to the major substrate plane. Thus it is advantageously possible, according to the present invention, that a pressure sensor is implemented that is monolithically integrated with an acceleration sensor, both sensors being based on, in particular, a piezoresistive sensor principle. Since the manufacturing steps for manufacturing the acceleration sensor are essentially identical to those steps for manufacturing the pressure sensor, the manufacturing of the micromechanical device having both types of sensor may be carried out especially rapidly, cost-effectively and precisely. In addition, it is possible thereby that, because of the utilization of the expansion of the seismic mass as location for the pressure sensor, an especially compact implementation both of a pressure sensor and of an acceleration sensor is made possible.

Moreover, according to the present invention, it may be provided that the clearance and the cavity are provided essentially in a common plane, parallel to the main substrate plane, and below the front side surface. It is thereby advantageously possible that identical method steps lead both to the generation of the clearance and to the generation of the cavity, so that the micromechanical devices according to the present invention are able to be manufactured particularly simply and cost-effectively.

It may be further provided that a transition between the spring pattern and the substrate material is provided and/or that at the transition between the diaphragm pattern and the seismic mass a sensor element is provided. Because of this, it is possible, using simple means, to achieve an especially precise sensing both of the acceleration values and the pressure values.

It may be further provided that a circuit pattern of an electronic circuit for analyzing and/or processing of signals emanating from the sensor element or modified by the sensor element is introduced into the substrate material, the generation of the circuit pattern being provided, at least partially, simultaneously with the generation of the sensor pattern. This makes it possible to produce a complete, combined sensor or a complete, combined sensor unit, which not only has both the patterns that are sensitive to the mechanical variables to be measured, but also implements a preprocessing of the sensor signals, possibly even being furnished with a certain intelligence. Intelligent preprocessing in this context is understood to mean that a relationship is already being produced among the signals emanating from the sensor patterns measuring the different mechanical variables, so that non-plausible combinations, for instance, of pressure and acceleration values are either not forwarded or their non-plausibility is at least indicated or signaled.

According to the present invention, it may be provided that essentially a semiconductor material is provided as substrate material and/or that the spring pattern and the diaphragm pattern include essentially a monocrystalline material, e.g., monocrystalline silicon. This allows an especially cost-effective production of piezo-sensors which respond to even slight deflections of the diaphragm and the spring pattern, and thus operate with an especially high sensitivity.

The method according to the present invention has the advantage that the sensor patterns for the acceleration sensor and the pressure sensor are produced simultaneously, so that the production of the device according to the present invention is implementable in a particularly cost-effective manner. It is particularly advantageous that the seismic mass is made of substrate material, e.g., of semiconductor material. In the method according to the present invention, it may be provided that, for the application of the diaphragm patterning and the spring patterning into the substrate material, a partial area of the substrate material is etched to be porous, e.g., to have a porosity of more than 50%, such as more than 80%, and that the clearance or cavity is formed by relocating or dissolving out parts of the substrate material in the porously etched partial area. According to the present invention, this advantageously makes it possible to produce the clearance or cavity without the introduction of accesses and without the use of undercut-type etching methods. According to the present invention, it is also advantageous that, before carrying out the second step, an etch stop layer, e.g., made of silicon oxide, is formed in the area of the clearance that is to be formed. The patterning of the seismic mass may thus be implemented in an especially precise manner, with the aid of a bulk-micromechanical processing sequence, from the rear of the semiconductor material.

The present invention further provides a combined acceleration sensor and pressure sensor having a micromechanical device. Because of this, altogether a cost-effective overall design approach is possible, with a single evaluation circuit for evaluating signals from both sensor patterns.

BRIEF DESCRIPTION OF THE DRAWINGS

FIG. 1 shows a sectional illustration and a top view of a precursor structure of a micromechanical device according to the present invention.

FIG. 2 shows a sectional illustration and a top view of a first example embodiment of the micromechanical device according to the present invention.

DETAILED DESCRIPTION

Figure 3:
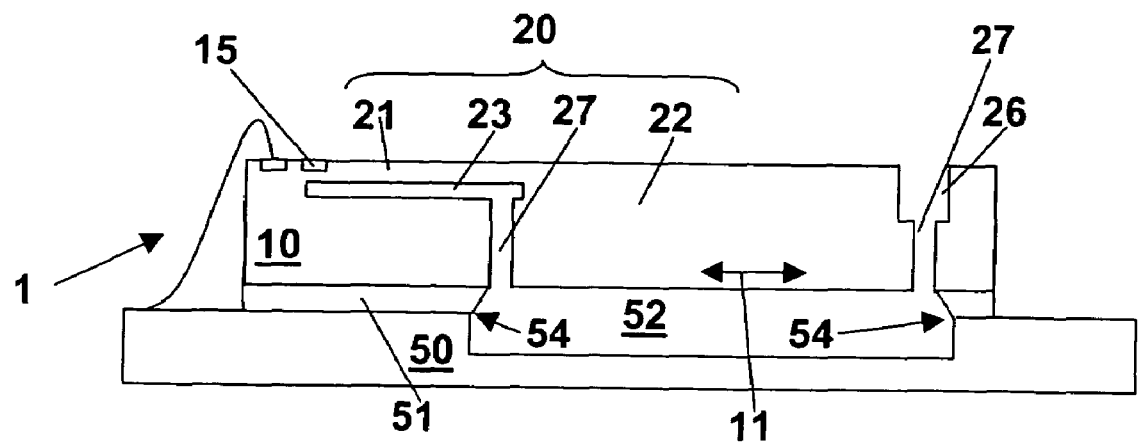
FIG. 3 shows a sectional illustration of the first example embodiment of the micromechanical device according to the present invention on a carrier substrate.

FIG. 1 shows a first precursor structure 1' of the micromechanical device according to the present invention. FIG. 1 shows, in the lower part of FIG. 1, a top view having a sectional line A-A. In the upper part of FIG. 1, a sectional illustration of a section taken along sectional line A-A is shown. On a substrate material 10, which is provided as semiconductor material (e.g., a silicon wafer), and is therefore also designated as semiconductor material 10 in the following, a cavity 23' is introduced as precursor of a clearance, described in greater detail below, under a spring pattern 21. Cavity 23' is applied using the method steps of application of doping areas, subsequent porous etching and further subsequent thermal relocation. According to the present invention, semiconductor material 10 is a p-substrate, for instance, and the dopings introduced for the porous etching are negatively doped doping regions. Both the production of porous silicon regions using porous etching and the production of cavity 23' are carried out according to a method described in published German Patent Document DE 100 32 579. This printed publication may be referenced with respect to the method for anodizing, i.e., to produce porous regions in semiconductor material 10 and to produce cavity 23'. Substrate material 10 has a major substrate plane 11 that is indicated by a double arrow in FIG. 1. Moreover, substrate material 10 has a front side 12 and a back surface 13. Cavity 23' is introduced close to, and below front side 12 into substrate material 10, and, to be sure, essentially in a plane parallel to major substrate plane 11.

After the introduction of cavity 23' as precursor of the clearance below spring pattern 21, a first trench 26 is applied to front side 12 of substrate material 10. This first trench 26 is used to determine the region of a seismic mass 22. In the region of cavity 23', the trench runs in such a way that the (previously completely closed) cavity 23' is opened towards front side 12. This opening of cavity 23' takes place in a lateral region of cavity 23'. First trench 26 is generated particularly using a trench etching method, using which one is able to achieve a large aspect ratio, that is, one is able to etch very deeply into the material of the precursor structure of the micromechanical device, at a comparatively small trench width.

Subsequent to the lateral opening of cavity 23', there takes place the production of an etch stop layer 25 for an etching process that is to be carried out later, in which a second trench is applied to substrate material 10 starting from back surface 13. An oxide layer has particularly proven itself as such an etch stop layer 25. For this, the region of cavity 23' are oxidized, that is, including the inner sides of cavity 23' that is opened using first trench 26, to form etch stop layer 25, for example, using a TEOS oxide deposition (deposition using TEOS (tetraethoxysilane) as the silicon source for depositing silicon dioxide onto a surface).

FIG. 2 shows a first example embodiment of micromechanical device 1 according to the present invention in a sectional illustration and in a top view, i.e., the lower part of FIG. 2 showing a top view having a sectional line B-B, and the upper part of FIG. 2 showing a sectional illustration of a section taken along sectional line B-B. The entire substrate material 10 is cut through in patterned fashion, using second trench 27. In the process, along essentially first trench 26, there takes place a separation of seismic mass 22 from substrate material 10. In the area of oxide layer 25 created on the inside of opened cavity 23' (cf. FIG. 1), the etching of second trench 27 is stopped, so that spring pattern 21 is not cut through. The masking for the patterning of second trench 27 may be made, for example, using a photoresist or an oxide mask on back surface 13. After the application of the second trench, etch stop layer 25 is removed in the area of opened cavity 23', so that seismic mass 22 becomes exposed. This etching takes place, for instance, by wet etching or by plasma etching, or by gas phase etching or HF vapor etching.

Also in FIG. 2, on front side 12 and back surface 13 of substrate material 10, and furthermore at the edge of spring pattern 21, a plurality of sensor elements 15 is indicated. Sensor elements 15 are particularly provided as piezoelectric sensor elements 15, for instance, as doping areas within a preferably monocrystalline region of substrate material 10.

As may also be seen in FIG. 2, second trench 27 is suitable for separating the different micromechanical devices 1, which are processed in common on one wafer. For this purpose, additional trenches 28, which are used for the separation, are shown outside the dimensions of micromechanical device 1.

However, according to the present invention, these additional trenches 28 are applied especially in common with second trench 27 to back surface 13 of substrate material 10. In order to avoid an uncontrolled coming apart of the micromechanical patterns after the back surface etching step for generating second trench 27, according to the present invention a carrier foil is laminated onto front side 12 of substrate material 10 before this step. A so-called UV tape is particularly suitable for this, whose adherence is able to be sharply reduced by irradiation with UV light. After the separation of individual micromechanical patterns 10 it is therefore possible that, because of the UV irradiation, and subsequent blowing off, a gentle removal of the carrier foil can be performed. The separation by back surface etching has the advantage that no sawing residues are able to get into first or second trenches 26, 27. However, it is alternatively also possible to provide a wafer saw for separation of the patterns. In this instance, a foil may be adhered to the lower side, for example, in order, once again, to minimize the probability of contamination of trenches 26, 27 by particles.

FIG. 3 shows a sectional illustration the first example embodiment of the micromechanical device according to the present invention fastened on a carrier substrate 50. Carrier substrate 50, in this instance, is a printed circuit board, for example, or another type of substrate, for instance, a ceramic substrate. To fasten structure 10 on carrier substrate 50, a fastening agent 51 is used, for instance, a solder or an adhesive or the like. In order for none of fastening agent 51 to be able to get into trenches 26, 27, a flow-stopping structure, such as an edge 54, may be provided. Fastening agent 51 then spreads only as far as to edge 54, and not into the gaps of first and second trenches 26, 27. In between flow-stopping structure 54 a recess 52 may be provided in carrier substrate 50, in order, for example, to make a downward deflection possible for seismic mass 22. In FIG. 3, spring pattern 21, clearance 23 and seismic mass 22 form a sensor pattern 20 for the development of an acceleration sensor that is sensitive to linear accelerations perpendicular to major substrate plane 11. Deflections of seismic mass 22, upwards or downwards, have the effect of bending spring pattern 21, and accordingly generate a signal that is detectable using, e.g., a piezoelectric or piezoresistive sensor element 15.

Figure 4:
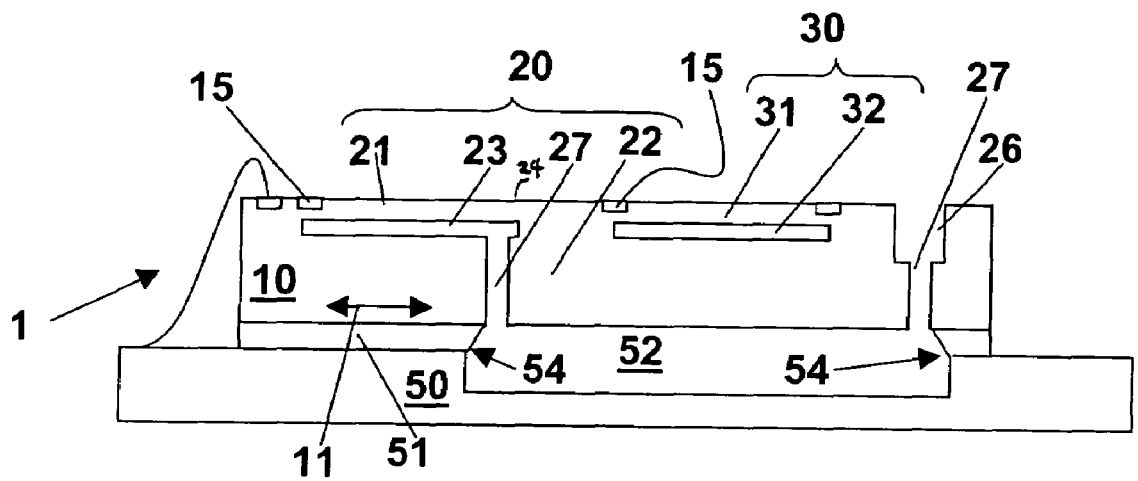
FIG. 4 shows a sectional illustration of a second example embodiment of the micromechanical device according to the present invention on a carrier substrate.

FIG. 4 shows a sectional illustration of a second example embodiment of micromechanical device 10 according to the present invention fastened on carrier substrate 50. In FIG. 4, spring pattern 21, clearance 23 and seismic mass 22 also form a sensor pattern 20 for the development of an acceleration sensor that is sensitive to linear accelerations perpendicular to major substrate plane 11. In the second example embodiment of device 10, it is now provided that an additional sensor pattern 30 is formed of a diaphragm pattern 31 and a cavity 32. According to the present invention, cavity 32 is formed in common with cavity 23'. By contrast to cavity 23' first trench 26 does not open cavity 32, so that cavity 32 remains completely closed according to the present invention, and can be used together with diaphragm pattern 31 and additional sensor elements 15 as an absolute pressure sensor, which is provided inside (or at the surface of) seismic mass 22. It may also be recognized in FIG. 4 that spring pattern 21 and seismic mass 22 have a front side surface 24 in common. Because of this, in the second example embodiment of micromechanical device 1, according to the present invention, it is possible to apply additional sensor pattern 30 in seismic mass 22, the former being produced simultaneously with sensor pattern 20.

What is claimed is:

1. A micromechanical device, comprising:
  a substrate material having a major substrate plane, wherein the substrate material is fastened to a carrier substrate;
  a first sensor pattern that includes a spring pattern and a seismic mass, wherein the seismic mass is connected to the substrate material via the spring pattern, wherein one of (a) a clearance is provided in a direction perpendicular to the major substrate plane between the spring pattern and the substrate material, and (b) the spring pattern and the seismic mass have a common, essentially continuous, front side surface;
  a first and second trench to allow for the substrate material to be fastened to the carrier substrate; and
  a second sensor pattern provided in the seismic mass, wherein the second sensor pattern has (a) a diaphragm pattern provided on the common, essentially continuous front side surface and (b) a closed cavity provided in a direction perpendicular to the major substrate plane below the diaphragm pattern, wherein the closed cavity is adjacent to the seismic mass.

2. The device as recited in claim 1, wherein the clearance and the closed cavity are provided essentially in a common plane parallel to the major substrate plane and below the common, essentially continuous front side surface.

3. The device as recited in claim 1, further comprising:
  a piezoelectric sensor element provided at least one of (a) at a transition between the spring pattern and the substrate material, and (b) at a transition between the diaphragm pattern and the seismic mass.

4. The device as recited in claim 3, further comprising: a circuit pattern of an electronic circuit for at least one of evaluating and processing of signals one of emanating from the piezoelectric sensor element and modified by the piezoelectric sensor element, wherein the circuit pattern is applied to the substrate material, and wherein the circuit pattern is at least partly generated simultaneously with generation of the first and second sensor patterns.

5. The device as recited in claim 1, wherein at least one of: (a) a semiconductor material is provided as the substrate material; and (b) the spring pattern and the diaphragm pattern include a monocrystalline silicon.

6. The device as recited in claim 1, wherein the device is configured as an acceleration and pressure sensor.

7. The device as recited in claim 1, further comprising:
  a piezoelectric sensor element provided at least one of (a) at a transition between the spring pattern and the substrate material, and (b) at a transition between the diaphragm pattern and the seismic mass;
  wherein the clearance and the closed cavity are provided essentially in a common plane parallel to the major substrate plane and below the common, essentially continuous front side surface, and
  wherein a semiconductor material is provided as the substrate material, and the spring pattern and the diaphragm pattern include a monocrystalline silicon.

8. The device as recited in claim 7, further comprising:
  a circuit pattern of an electronic circuit for at least one of evaluating and processing of signals one of emanating from the piezoelectric sensor element and modified by the piezoelectric sensor element, wherein the circuit pattern is applied to the substrate material, and wherein the circuit pattern is at least partly generated simultaneously with generation of the first and second sensor patterns.

* * * * *

UNITED STATES PATENT AND TRADEMARK OFFICE
CERTIFICATE OF CORRECTION

PATENT NO. : 7,647,832 B2
APPLICATION NO. : 11/600672
DATED : January 19, 2010
INVENTOR(S) : Muchow et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 338 days.

Signed and Sealed this

Sixteenth Day of November, 2010

David J. Kappos
*Director of the United States Patent and Trademark Office*